(12) United States Patent
Yu

(10) Patent No.: US 11,171,312 B2
(45) Date of Patent: Nov. 9, 2021

(54) DISPLAY PANEL AND DISPLAY DEVICE HAVING DISPERSION AND NON-DISPERSION AREAS

(71) Applicant: WUHAN CHINA STAR OPTOELECTRONICS SEMICONDUCTOR DISPLAY TECHNOLOGY CO., LTD., Hubei (CN)

(72) Inventor: Wenjing Yu, Hubei (CN)

(73) Assignee: WUHAN CHINA STAR OPTOELECTRONICS SEMICONDUCTOR DISPLAY TECHNOLOGIES CO., LTD., Hubei (CN)

(*) Notice: Subject to any disclaimer, the term of this patent is extended or adjusted under 35 U.S.C. 154(b) by 561 days.

(21) Appl. No.: 16/086,457

(22) PCT Filed: Aug. 8, 2018

(86) PCT No.: PCT/CN2018/099398
§ 371 (c)(1),
(2) Date: Sep. 19, 2018

(87) PCT Pub. No.: WO2019/227669
PCT Pub. Date: Dec. 15, 2019

(65) Prior Publication Data
US 2021/0184178 A1    Jun. 17, 2021

(30) Foreign Application Priority Data

May 28, 2018 (CN) .......................... 201810519539.6

(51) Int. Cl.
*H01L 51/52* (2006.01)
*H01L 27/32* (2006.01)
(Continued)

(52) U.S. Cl.
CPC ........ *H01L 51/5275* (2013.01); *H01L 27/322* (2013.01); *H01L 27/3211* (2013.01);
(Continued)

(58) Field of Classification Search
CPC ............. H01L 51/5275; H01L 51/5253; H01L 27/3211; H01L 27/322; G02F 1/133512;
(Continued)

(56) References Cited

U.S. PATENT DOCUMENTS 7,391,484 B2 * 6/2008 Kaneko ............. G02F 1/133512
349/113
8,941,799 B2 * 1/2015 You ................... G02F 1/133512
349/104
(Continued)

FOREIGN PATENT DOCUMENTS

CN         103928489 A    7/2014
CN         105954947 A    9/2016
CN         107546338 A    1/2018

*Primary Examiner* — Ida M Soward

(57) ABSTRACT

A display panel and a display device are provided. The display panel includes a substrate, display units, a thin film encapsulation layer, a dispersion layer, a color filter substrate, and a cover plate, wherein the dispersion layer includes dispersion areas and non-dispersion areas, and the dispersion areas consist of several regions of different refractive index.

6 Claims, 1 Drawing Sheet

(51) Int. Cl.
   *G02F 1/133* (2006.01)
   *G02F 1/136* (2006.01)
   *G02F 1/1335* (2006.01)
   *G02F 1/1362* (2006.01)
(52) U.S. Cl.
   CPC .... *H01L 51/5253* (2013.01); *G02F 1/133512* (2013.01); *G02F 1/133514* (2013.01); *G02F 1/136209* (2013.01)
(58) Field of Classification Search
   CPC ......... G02F 1/133514; G02F 1/136209; G02F 2001/136222
   See application file for complete search history.

(56) References Cited

U.S. PATENT DOCUMENTS

| | | | |
|---|---|---|---|
| 8,969,904 B2* | 3/2015 | Chao | H01L 27/322 257/98 |
| 9,082,668 B2* | 7/2015 | Kim | H01L 27/1222 |
| 9,112,183 B2* | 8/2015 | Ohta | H01L 51/5281 |
| 9,337,244 B2* | 5/2016 | Hatano | H01L 27/3246 |
| 10,043,439 B2* | 8/2018 | Nakamura | G09G 3/32 |
| 10,185,861 B2* | 1/2019 | Zeng | H01L 27/3265 |
| 10,205,112 B2* | 2/2019 | Wang | H01L 51/0072 |
| 10,319,792 B2* | 6/2019 | Jo | H01L 27/322 |
| 10,454,068 B2* | 10/2019 | Lee | H01L 51/0096 |
| 10,566,577 B2* | 2/2020 | Liu | H01L 51/5253 |
| 2005/0275343 A1 | 12/2005 | Tanaka | |
| 2007/0077502 A1* | 4/2007 | Moriya | G02F 1/13363 430/7 |
| 2013/0320842 A1 | 12/2013 | Park et al. | |
| 2015/0188082 A1 | 7/2015 | Rohatgi | |
| 2016/0190508 A1* | 6/2016 | Nakamura | H01L 27/3246 257/40 |
| 2018/0061894 A1* | 3/2018 | Kim | H01L 51/5268 |
| 2018/0364521 A1* | 12/2018 | Baek | G02B 5/3058 |
| 2019/0067643 A1 | 2/2019 | Zhai et al. | |
| 2019/0220126 A1* | 7/2019 | Heo | H01L 51/5253 |
| 2020/0152917 A1* | 5/2020 | Kudo | H01L 51/5284 |
| 2021/0278722 A1* | 9/2021 | Lee | G02F 1/133514 |

* cited by examiner

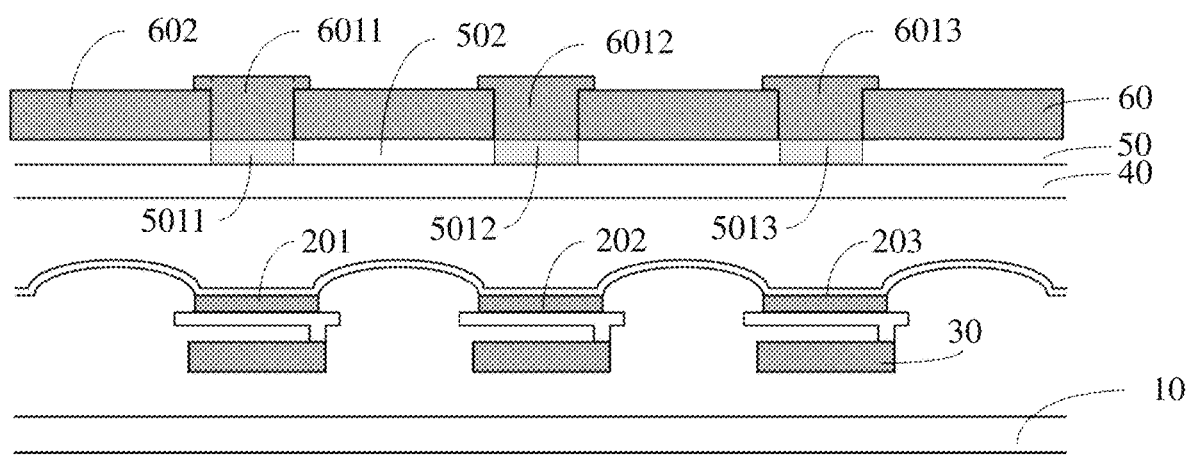

DISPLAY PANEL AND DISPLAY DEVICE HAVING DISPERSION AND NON-DISPERSION AREAS

FIELD OF INVENTION

The present disclosure relates to a technical field of liquid crystal displays, and in particular to a display panel and a display device.

BACKGROUND OF INVENTION

In flat panel display technology, organic light-emitting diode (OLED) displays have many advantages, such as lightness, thinness, active light emission, fast response times, wide viewing angles, wide color gamut, high brightness, and low power consumption so that the OLED displays gradually become the third generation of display technology behind liquid crystal displays (LCD). OLED displays have advantages of more power saving, thinner, and wider viewing angles, and LCDs cannot be compared to OLED displays. Currently, people have higher and higher resolution requirements for displays. Therefore, the production of high-quality and high-resolution OLED displays still face many challenges.

When a display panel is used outdoors, reflection of sunlight from a screen of the display panel is strong so that contrast of the display panel is very low. In order to improve the contrast, a polarizer (POL) is usually attached to the top of the screen. However, the polarizer absorbs about 55% of the light emitted by the OLED while absorbing the sunlight. Therefore, it is difficult to increase luminous efficiency of OLED displays.

Therefore, the present disclosure proposes the following technical solutions based on the above technical problems.

SUMMARY OF INVENTION

An object of the present disclosure is to provide a display panel and a display device, which solve the technical problem with low luminous efficiency of existing display.

To solve the above problems, the present disclosure provides the following technical solutions:

A display panel is provided, which comprises a substrate, a plurality of display units, a thin film encapsulation layer, a dispersion layer, a color filter substrate, and a cover plate. The display units are formed on the substrate, the thin film encapsulation layer is formed on the display units, and the dispersion layer is formed on the thin film encapsulation layer, wherein the dispersion layer includes a plurality of dispersion areas and a plurality of non-dispersion areas, and the dispersion areas and the non-dispersion areas are arranged alternately. The color filter substrate is formed on the dispersion layer, wherein the color filter substrate includes a plurality of color filter units corresponding to the display units, respectively, and a plurality of shielding layers, and each of the shielding layers are disposed in a space between two color filter units. The cover plate is formed on the color filter substrate.

In one embodiment of the present disclosure, the dispersion area includes a first dispersion region, a second dispersion region and a third dispersion, and a refractive index of the first dispersion region, a refractive index of the second dispersion region and a refractive index of the third dispersion region are different from each other.

In one embodiment of the present disclosure, the first dispersion region includes a plurality of first areas corresponding to the display units, the first areas have equal areas, and orthographic projections of the display units on the dispersion layer are located in the first areas; the second dispersion region includes a plurality of second areas corresponding to the display units, an area of the second areas are equal, and an orthographic projection of the display units on the dispersion layer are located in the second areas; the third dispersion region includes a plurality of third areas corresponding to the display units, an area of the third areas are equal, and an orthographic projection of the display units on the dispersion layer are located in the third areas.

In one embodiment of the present disclosure, a shape of the display unit is a polygon or a circle.

In one embodiment of the present disclosure, a minimum refractive index of the dispersion layer is not less than a refractive index of the color filter substrate or a refractive index of the thin film encapsulation layer.

In one embodiment of the present disclosure, the non-dispersion areas are made of a black shading material.

In one embodiment of the present disclosure, each of the color filter units has a color that is the same as a color of a corresponding one of the display units that correspond to said color filter unit.

In one embodiment of the present disclosure, the display units are one of red sub-pixels, green sub-pixels and blue sub-pixels.

In one embodiment of the present disclosure, the display units include first display units, second display units and third display units; the first display units, the second display units and the third display units are one of the red sub-pixels, the green sub-pixels and the blue sub-pixels, and a color of the sub-pixels of the first display units, the second display units and the third display units are different.

The present disclosure further provides a display device, wherein the display device comprises said display panel.

The present disclosure further provides a display panel, which comprises a substrate, a plurality of display units, a thin film encapsulation layer, a dispersion layer, a color filter substrate, and a cover plate. The display units are formed on the substrate, the thin film encapsulation layer is formed on the display units, and the dispersion layer is formed on the thin film encapsulation layer, wherein the dispersion layer includes dispersion areas and non-dispersion areas, and the dispersion areas and the non-dispersion areas are arranged alternatively. The dispersion area includes a first dispersion region, a second dispersion region and a third dispersion. The color filter substrate is formed on the dispersion layer, wherein the color filter substrate includes a plurality of color filter units corresponding to the display units and shielding layers, and each of the shielding layers are disposed in a space between two color filter units. The cover plate is formed on the color filter substrate.

In one embodiment of the present disclosure, the first dispersion region includes a plurality of first areas corresponding to the display units, the first areas have equal areas, and orthographic projections of the display units on the dispersion layer are located in the first areas; the second dispersion region includes a plurality of second areas corresponding to the display units, an area of the second areas are equal, and an orthographic projection of the display units on the dispersion layer are located in the second areas; the third dispersion region includes a plurality of third areas corresponding to the display units, an area of the third areas are equal, and an orthographic projection of the display units on the dispersion layer are located in the third areas.

In one embodiment of the present disclosure, a shape of the display unit is a polygon or a circle.

In one embodiment of the present disclosure, a minimum refractive index of the dispersion layer is not less than a refractive index of the color filter substrate or a refractive index of the thin film encapsulation layer.

In one embodiment of the present disclosure, the non-dispersion areas are made of a black shading material.

In one embodiment of the present disclosure, each of the color filter units has a color that is the same as a color of a corresponding one of the display units that correspond to said color filter unit.

In one embodiment of the present disclosure, the display units are one of red sub-pixels, green sub-pixels and blue sub-pixels.

In one embodiment of the present disclosure, the display units include first display units, second display units and third display units; the first display units, the second display units and the third display units are one of the red sub-pixels, the green sub-pixels and the blue sub-pixels, and a color of the sub-pixels of the first display units, the second display units and the third display units are different.

The beneficial effect is that the present disclosure disposes with the dispersion layer between the thin film encapsulation layer and the color filter substrate in the display panel, wherein the dispersion layer includes a plurality of dispersion areas and a plurality of non-dispersion areas, and the dispersion areas consist of several regions of different refractive index so that the external light passes through the dispersion layer and is absorbed by the shielding layers placed on the color filter substrate. Thus, the luminous efficiency of the display unit can be improved and the contrast of the display panel can be increased.

DESCRIPTION OF DRAWINGS

In order to more clearly illustrate the embodiments or the prior art technical solutions embodiment of the present disclosure, will implement the following FIGURES for the cases described in the prior art or require the use of a simple introduction. Obviously, the following description of the drawings are only some of those of ordinary skill in terms of creative effort without precondition, you can also obtain other drawings based on these drawings embodiments of the present disclosure.

The FIGURE is a structural diagram of a film layer of a display panel according a preferred embodiment of the present disclosure.

DETAILED DESCRIPTION OF PREFERRED EMBODIMENTS

Structure and technical means adopted by the present disclosure to achieve the above and other objects can be best understood by referring to the following detailed description of the preferred embodiments and the accompanying drawings. Furthermore, directional terms described by the present disclosure, such as upper, lower, front, back, left, right, inner, outer, side, longitudinal/vertical, transverse/horizontal, etc., are only directions by referring to the accompanying drawings, and thus the used directional terms are used to describe and understand the present disclosure, but the present disclosure is not limited thereto.

FIGURE shows a structural diagram of a film layer of a display panel according a preferred embodiment of the present disclosure, wherein the display panel comprises a substrate 10 and a plurality of display units. The raw material of the substrate 10 is a glass substrate, a quartz substrate, or a resin substrate. The display units are formed on the substrate 10, wherein the display units include first display units 201, second display units 202 and third display units 203. In the embodiment, the display units are one of red sub-pixels, green sub-pixels and blue sub-pixels. It means the first display units 201, the second display units 202 and the third display units 203 are one of red sub-pixels, green sub-pixels and blue sub-pixels, and a color of the sub-pixels of the first display units 201, the second display units 202 and the third display units 203 are different.

In addition, an organic light-emitting diode (OLED) film layer is disposed between the display units and the substrate 10, and the OLED film layer includes an anode layer, a pixel definition layer, a first common layer, a luminous layer, a second common layer, and a cathode layer, wherein the luminous layer is an organic semiconductor, which has a structure of a special energy band. Electrons generated from the cathode layer and holes generated from the anode layer meet in the luminous layer, and then photons with a certain wavelength are distributed. The photons enter to eyes of a person and become colors that the person sees. The photons as light sources of the display panel generate different colors of light through different color sub-pixels.

The thin film encapsulation layer 40 is formed on the display units, and the thin film encapsulation layer 40 functions to block water and oxygen, to prevent external water vapor from corroding an organic light emitting layer. The thin film encapsulation layer 40 is formed by alternately stacking an organic encapsulation layer and an inorganic encapsulation layer. Typically, the organic encapsulation layer is located in the middle of the thin film encapsulation layer 40, and the inorganic encapsulation layer is located at two sides of the thin film encapsulation layer 40 to package the organic encapsulation layer in the middle.

Although the organic encapsulation layer is flexible, and the ability to block water and oxygen is limited. The inorganic encapsulation layer has a greater ability to block water and oxygen. However, when a certain thickness is reached, it is difficult to prepare a dense and high-quality film of the inorganic encapsulation layer, and the film is rigid and easily to be broken. Therefore, most flexible packaging materials are package structures made of alternating composite structures of organic or inorganic multilayer films.

The dispersion layer 50 is formed on the thin film encapsulation layer 40, wherein the dispersion layer 50 includes a plurality of dispersion areas and a plurality of non-dispersion areas 502, and the dispersion areas and the non-dispersion areas are arranged alternately. The dispersion area includes a first dispersion region 5011, a second dispersion region 5012 and a third dispersion 5013, and a refractive index of the first dispersion region 5011, a refractive index of the second dispersion region 5012 and a refractive index of the third dispersion region 5013 are different.

In one embodiment of the present disclosure, the first dispersion region 5011 includes a plurality of first areas corresponding to the display units, the first areas have equal areas, and orthographic projections of the display units on the dispersion layer 50 are located in the first areas. The second dispersion region 5012 includes a plurality of second areas corresponding to the display units, an area of the second areas are equal, and an orthographic projection of the display units on the dispersion layer 50 are located in the second areas. The third dispersion region 5013 includes a plurality of third areas corresponding to the display units, an area of the third areas are equal, and an orthographic projection of the display units on the dispersion layer 50 are located in the third areas. Preferably, a shape of the display unit is a polygon or a circle in the embodiment.

In addition, the non-dispersion areas are shielding layers and made of a black shading material or constituted by other organic matters that can relieve stress.

In the embodiment, a minimum refractive index of the dispersion layer 50 is not less than a refractive index of the color filter substrate or a refractive index of the thin film encapsulation layer, wherein light is irradiated to a sparse media from a dense media so that the light irradiated to the thin film encapsulation layer is totally reflected as much as possible and enters the black matrix of the color filter substrate. The light is not totally reflected when the light is irradiated to the dense media from the sparse media. In addition, the present disclosure is not limited about the relationship between refractive index of the film layers.

In the present disclosure, the dispersion layer 50 is disposed on a POL-Less structure, and color filters (CF) are placed on the pixels (R, G, B) of OLED corresponding to the color of the color filters. A black matrix is filled between two color filters, and the light emitted from the OLED can be transmitted through the color filter. When sunlight hits a surface of the device, the light of the color corresponding to color filters can pass through luminous areas. Sunlight in non-luminous areas can be absorbed by the black matrix.

Moreover, A dispersion layer 50 is coated between the color filters and the thin film encapsulation layer, and external light transmitted by the color filters is absorbed by the black matrix after being refracted and reflected by the dispersion layer 50. The prior art has certain limitations. Because of the problem of refractive index, the external light may be penetrated by the color filters after the external light has been refracted and reflected by the dispersion layer.

Therefore, the present disclosure disposes the dispersion layer with different refractive index regions so that the external light is absorbed by the shielding layer placed on the color filter substrate through the dispersion layer. Thus, the luminous efficiency of the display unit can be improved and the contrast of the display panel can be increased.

The color filter substrate 60 is formed on the dispersion layer 50, and the color filter substrate 60 includes a base substrate (not shown), a color filter layer, and shielding layers 602, wherein the base substrate has the same material as the substrate 10 in the embodiment, and they belong to the same type of substrate. The color filter layer has a plurality of color filter units including first color filter units 6011, second color filter units 6012 and third color filter units 6013, wherein the first color filter units 6011 correspond to the first display units 201, respectively, the second color filter units 6012 correspond to the second display units 202, respectively, and the third color filter units 6013 correspond to the third display units 203, respectively.

The color filter units correspond to the display units, respectively. The color filter units are one of red color block, green color block and blue color block, wherein each of the color filter units has a color that is the same as a color of a corresponding one of the display units that correspond to said color filter unit. When the first display units 201 are red sub-pixels, the second display units 202 are green sub-pixels and the third display units 203 are blue sub-pixels, the corresponding first color filter units 6011 are red color block, the corresponding second color filter units 6012 are green color block and the corresponding third color filter units 6013 are blue color block.

The shielding layers 602 are disposed in a space between two color filter units, and the shielding layers 602 are made of a black shading material.

In the embodiment, when the external light enters the dispersion layer 50 through different color filter units, the external light is absorbed by the shielding layers 602 through changing the refractive index of the material. The external light passes through the different color units, wherein a wavelength of red light, a wavelength of green light and a wavelength of blue light are different. When the dispersion regions are disposed, it sets the corresponding refractive index of the dispersion regions according to the sub-pixel of the corresponding color.

The cover plate (not shown) is formed on the color filter substrate 60, and the cover plate is configured to protect the film layers of the display panel.

The present disclosure further provides a display device, the display device comprises said display panel.

The present disclosure provides a display panel and a display device, wherein the display panel comprises a substrate, a plurality of display units, a thin film encapsulation layer, a dispersion layer, a color filter substrate, and a cover plate, wherein the dispersion layer includes a plurality of dispersion areas and a plurality of non-dispersion areas, and the dispersion areas consist of several regions of different refractive index. The present disclosure disposes with the dispersion layer with different refractive index regions so that the external light passes through the dispersion layer and is absorbed by the shielding layers placed on the color filter substrate. Thus, the luminous efficiency of the display unit can be improved and the contrast of the display panel can be increased.

The present disclosure has been described with preferred embodiments thereof and it is understood that many changes and modifications to the described embodiments can be carried out without departing from the scope and the spirit of the invention that is intended to be limited only by the appended claims.

What is claimed is:

1. A display panel, comprising:
   a substrate;
   a plurality of display units formed on the substrate;
   a thin film encapsulation layer formed on the plurality of display units;
   a dispersion layer formed on the thin film encapsulation layer, wherein the dispersion layer includes a plurality of dispersion areas and a plurality of non-dispersion areas, and the plurality of dispersion areas and the plurality of non-dispersion areas are arranged alternately;
   wherein one of the plurality of dispersion areas includes a first dispersion region, a second dispersion region and a third dispersion, wherein a refractive index of the first dispersion region, a refractive index of the second dispersion region and a refractive index of the third dispersion region are different from each other;
   a color filter substrate formed on the dispersion layer, wherein the color filter substrate includes a plurality of color filter units corresponding to the plurality of display units, respectively, and a plurality of shielding layers, and each of the shielding layers are disposed in a space between two color filter units; and
   a cover plate formed on the color filter substrate.

2. The display panel according to claim 1, wherein a shape of the display unit is a polygon or a circle.

3. The display panel according to claim 1, wherein a minimum refractive index of the dispersion layer is not less than a refractive index of the color filter substrate or a refractive index of the thin film encapsulation layer.

4. The display panel according to claim 1, wherein the plurality of non-dispersion areas are made of a black shading material.

5. The display panel according to claim 1, wherein each of the color filter units has a color that is the same as a color of a corresponding one of the plurality of display units that correspond to said color filter unit.

6. A display device, comprising a display panel according to claim 1.

* * * * *